(12) United States Patent
Fukui et al.

(10) Patent No.: US 8,506,708 B2
(45) Date of Patent: Aug. 13, 2013

(54) SILICA GLASS CRUCIBLE FOR PULLING UP SILICON SINGLE CRYSTAL, METHOD FOR MANUFACTURING THEREOF AND METHOD FOR MANUFACTURING SILICON SINGLE CRYSTAL

(75) Inventors: Masanori Fukui, Akita (JP); Satoshi Kudo, Tokyo (JP)

(73) Assignee: Japan Super Quartz Corporation, Akita (JP)

( * ) Notice: Subject to any disclaimer, the term of this patent is extended or adjusted under 35 U.S.C. 154(b) by 936 days.

(21) Appl. No.: 12/607,519

(22) Filed: Oct. 28, 2009

(65) Prior Publication Data
US 2010/0107965 A1 May 6, 2010

(30) Foreign Application Priority Data

Oct. 31, 2008 (JP) ................... 2008-282244
Oct. 31, 2008 (JP) ................... 2008-282245
Oct. 9, 2009 (JP) ................... 2009-235028

(51) Int. Cl.
*C30B 15/02* (2006.01)

(52) U.S. Cl.
USPC ............... 117/213; 117/13; 117/16; 117/200; 117/202

(58) Field of Classification Search
USPC ............... 117/13, 16, 200, 202, 213
See application file for complete search history.

(56) References Cited

U.S. PATENT DOCUMENTS 6,340,390 B1   1/2002   Asano et al.
2005/0235907 A1 *  10/2005  Ohama et al. ........... 117/200

FOREIGN PATENT DOCUMENTS

| JP | 1-261293   | 10/1989 |
| JP | 5-9097     | 1/1993  |
| JP | 2000-169287 | 6/2000  |
| JP | 2002-284596 | 10/2002 |
| JP | 2007-210803 | 8/2007  |

* cited by examiner

*Primary Examiner* — Bob M Kunemund
(74) *Attorney, Agent, or Firm* — Greenblum & Bernstein, P.L.C.

(57) ABSTRACT

A silica glass crucible for pulling up a silicon single crystal including a wall part and a bottom part is provided with a natural silica glass layer which forms at least one part of a an inner surface of the bottom part, and a synthetic silica glass layer which forms at least an inner surface of the wall part, wherein a concentration of Ca included in the natural silica glass layer is 0.5 ppm or less.

5 Claims, 7 Drawing Sheets

US 8,506,708 B2

SILICA GLASS CRUCIBLE FOR PULLING UP SILICON SINGLE CRYSTAL, METHOD FOR MANUFACTURING THEREOF AND METHOD FOR MANUFACTURING SILICON SINGLE CRYSTAL

TECHNICAL FIELD

The present invention is related to a silica glass crucible used for pulling up a silicon single crystal and a method for manufacturing the silica glass crucible. In particular, the present invention is related to a layered structure of the silica glass crucible. In addition, the present invention is related to a method of manufacturing a silicon single crystal which uses this type of silica glass crucible.

BACKGROUND OF THE INVENTION

A silica glass crucible is used in the manufacture of a silicon single crystal. In a Czochralski (CZ) method, polysilicon is charged into a silica glass crucible, heated and melted and a seed crystal is immersed in this silicon melt, and while mutually rotating the crucible and the seed crystal in opposite directions, the seed crystal is slowly pulled up and a silicon single crystal is grown. In order to manufacture a high purity silicon single crystal for use in semiconductor devices, it is necessary that the silicon single crystal not be polluted by an elution of the silica glass crucible and in addition, the silica glass crucible requires sufficient heat resistance strength.

There is natural silica and synthetic silica in the raw material of the silica glass crucible and generally natural silica has a lower level of purity than synthetic silica but has excellent heat resistance strength whereas synthetic silica has poor heat resistance strength but a high level of purity. Thus, a silica glass crucible having a two layered structure including forming an outer layer of the crucible with natural silica and increasing the strength of the crucible under a high temperature and forming an inner layer of the crucible which contacts with the silicon melt with synthetic silica and which prevents incorporating impurities, is generally used (refer to Japanese Patent Application Laid Open No. H01-261293). In addition, in order to control the amount of soluble oxygen within the silicon melt, a silica glass crucible has been proposed wherein an inner surface of the crucible wall part is formed with synthetic silica and natural silica which forms the outer layer is exposed at the bottom part of the crucible (refer to Japanese Patent Application Laid Open No. 2002-284596)

The weight of the silicon which is charged into a crucible is increasing due to the large scale of silicon ingots in recent years. As a result, it becomes more difficult to remove gas bubbles which are included within the silicon melt and these gas bubbles are incorporated into the silicon single crystal during growth causing cavity defects (also called voids or air pockets) which are formed within the crystal. Such problems have become noticeable. Argon (Ar) gas which is attached to the inner surface of the silica glass crucible, and silicon monoxide (SiO) gas which is produced by a reaction between the silica glass crucible and silicon melt are known as causes of the cavity defects. The cavity defects caused by gas bubbles largely have a spherical shape with a diameter of 300-500 μm taking up the majority of its size. However, small cavity defects with a diameter of 150 μm or less and very large cavity defects with a diameter of 1 mm or more are also sometimes formed. In this way, cavity defects caused by gas bubbles clearly have different characteristics to Grown-in defects such as COP (Crystal Originated Particle). Presently, the presence of these defects can not be nondestructively inspected. The cavity defects can be detected only after a wafer has been cut from the ingot and appear as through holes or pinholes on the surface or interior section of the wafer.

In recent years, the effects on semiconductor devices by pinholes with a wafer are extremely large. The effects of pinholes differ depending on the size, number, position of generation and type of semiconductor device. However, because pinholes are much large compared to COP, it is impossible to form devices in the spaces where pinholes exist. In particular, because yield of the semiconductor device decreases significantly when the number of pinholes within a wafer is large, the wafer itself has to be discarded. Therefore, it is necessary to reduce the possibility of pinholes being included within a wafer to almost zero.

In order to solves this problem, a method of adjusting a furnace pressure when melting polysilicon is proposed, for example, in Japanese Patent Application Laid Open Nos. H05-9097 and 2000-169287. In addition, a method of providing vibration to a crucible and starting growth of a silicon single crystal after reducing gas bubbles which are attached to the inner surface of the crucible is proposed in Japanese Patent Application Laid Open No. 2007-210803.

However, an environment for preventing generation of gas bubbles within the type of crucible described above and a process for removing gas bubbles are not sufficient for manufacturing a high quality silicon single crystal without cavity defects caused by gas bubbles. The crucible itself is required to possess properties which make it difficult for the gas bubbles to be produced.

SUMMARY OF THE INVENTION

The present invention solves the problems described above and the object of the present invention is to provide a silica glass crucible for pulling up a silicon single crystal which can prevent the production of cavity defects caused by gas bubbles included within the silicon single crystal.

In addition, the object of the present invention is to provide a manufacturing method of silica glass crucible which can manufacture a high quality silicon single crystal without cavity defects.

Furthermore, the object of the present invention is to provide a manufacturing method of a high quality silicon single crystal without cavity defects.

As a result of repeated keen research which should solve the above described problem, the inventors of the present invention discovered that fine damage on the inner surface of the crucible participates in the production of SiO gas by a reaction between the silica glass crucible and silicon melt. When fine damage exists on the inner surface of the crucible, it becomes easier for SiO gas to be produced with this fine damage at the center, and when this fine damage exists at the bottom part of the inner surface of the crucible, the SiO gas produced due to the fine damage as a nucleus rises up in the silicon melt and becomes incorporated into the silicon single crystal while being pulled up. In other words, it became clear that the fine damage which exists on the inner surface of the crucible bottom part is a large cause of the production of cavity defects within the silicon single crystal.

The present invention is based on this type of technical findings (knowledge) and the silica glass crucible according to the present invention is a silica glass crucible used for pulling up a silicon single crystal having a wall part and a bottom part, and is arranged with a natural silica glass layer forming at least one part of an inner surface of the bottom part and a synthetic silica glass layer forming at least an inner surface of the wall part, wherein a concentration of Ca included in the natural silica glass layer is 0.5 ppm or less.

The natural silica glass layer arranged on the inner surface of the crucible bottom part has a faster melting speed into the silicon melt that the synthetic silica glass layer. As a result, even when fine damage exists on the bottom surface of the crucible, it is possible to remove this damage within the short time from a polysilicon melting process up to the start of pulling up the single crystal. Therefore, it is possible to have the bottom surface of the crucible in a state without fine damage around the time when the pulling up process actually begins. Consequently, it is possible to solve the problem wherein the SiO gas produced due to the fine damage rises up in the silicon melt and becomes incorporated into the silicon single crystal. Furthermore, because the concentration of Ca in the natural silica glass layer is 0.5 ppm or less, it is possible to prevent an increase in spots of devitrification and obtain a favorable single crystal yield.

The silica glass crucible of the present invention preferably includes a first natural silica glass layer forming an outer layer in the wall part and the bottom part, a synthetic silica glass layer forming an inner layer in the wall part and the bottom part and exposed on at least the wall part, and a second natural silica glass layer which covers a region including the center of the bottom part in an inner surface of the synthetic silica glass layer, wherein the concentration of Ca included in the second natural silica glass layer is 0.5 ppm or less, and a thickness of the second natural silica glass layer is 30 μm or more and 200 μm or less.

The second natural silica glass layer arranged on the inner surface of the crucible bottom part has a faster melting speed into the silicon melt than the synthetic silica glass layer. As a result, even when fine damage exists on the bottom surface of the crucible, it is possible to remove this damage within the short time from a polysilicon melting process up to the start of pulling up the single crystal. Therefore, it is possible to have the bottom surface of the crucible in a state without fine damage around the time when the pulling up process actually begins. Consequently, it is possible to solve the problem wherein the SiO gas produced due to the fine damage rises up in the silicon melt and becomes incorporated into the silicon single crystal.

In addition, because the concentration of Ca included in the second natural silica glass layer is 0.5 ppm or less, it is possible to prevent an increase in spots of devitrification and obtain a favorable single crystal yield in the silica glass crucible for pulling up a silicon single crystal by the present invention. Moreover, because a thickness of the second natural silica glass layer is 30 μm or more it is possible to effectively remove fine damage which exists on the bottom surface of the crucible, and because the thickness of the second natural silica glass layer is 200 μm or less, it is possible to prevent a decrease in the single crystal yield due to a excessive melting of the natural silica glass layer.

In the present invention, it is preferable that the second natural silica glass layer cover at least the entire region corresponding to the projection plane of the silicon single crystal in the bottom surface. When SiO gas is produced in the region corresponding to the projection plane of the silicon single crystal, it is extremely likely that it will be included into the silicon single crystal, however, it is possible to solve this problem in the case where the second natural silica glass layer covers the entire projection plane of the silicon single crystal.

In the present invention, it is preferable that the concentration of Ca in the second natural silica glass layer is 0.4 ppm or less. In addition, it is particularly preferred that the thickness of the second natural silica glass layer is 30 μm or more and 100 μm or less. It is possible to obtain an even higher single crystal yield with these conditions.

A silica glass crucible of the present invention preferably includes a natural silica glass layer forming an outer layer in the wall part and the bottom part, a synthetic silica glass layer forming an inner layer in the wall part, wherein an inner surface of the natural silica glass layer is exposed in a region which includes the center of bottom part, and the concentration of Ca included in the natural silica glass layer is 0.5 ppm or less, and the concentration of Al included in the natural silica glass layer is 29 ppm or less.

The natural silica glass layer which forms the inner surface of the crucible bottom part has a faster melting speed into the silicon melt than the synthetic silica glass layer. As a result, even when fine damage exists on the bottom surface of the crucible, it is possible to remove this damage within the short time from a polysilicon melting process up to the start of pulling up the single crystal. Therefore, it is possible to have the bottom surface of the crucible in a state without fine damage around the time when the pulling up process actually begins. Consequently, it is possible to solve the problem wherein the SiO gas produced due to the fine damage rises up in the silicon melt and becomes incorporated into the silicon single crystal. Furthermore, because the concentration of Ca in the natural silica glass layer in the silica glass crucible for pulling up a silicon single crystal of the present by the present invention, is 0.5 ppm or less, it is possible to prevent an increase in spots of devitrification and obtain a favorable single crystal yield.

In the present invention, it is preferred that the exposed region of the natural silica glass layer includes a projection plane of the silicon single crystal. When SiO gas is produced in the region corresponding to the projection plane of the silicon single crystal, it is extremely likely that it will be included into the silicon single crystal, however, if the region which includes the projection plane of the silicon single crystal is formed by a natural silica glass layer, it is possible to surely prevent the generation of gas bubbles. In particular, the diameter of the exposed region of the natural silica glass layer is preferred to be $0.3R_0$ or more and $0.6R_0$ or less with respect to the diameter $R_0$ of an opening of the crucible. If the exposed region of the natural silica glass layer meets the conditions stated above with respect to the crucible diameter, there is no deficiency in heat resistance strength and no decrease in the single crystal yield due to excessive elution of impurities, and it is possible to securely prevent the generation of gas bubbles.

In the present invention, it is preferred that the concentration of Ca included in the natural silica glass layer is 0.4 ppm or less. In addition, it is preferred that the concentration of Al included in the natural silica glass layer is 10 ppm or less. With these conditions, it is possible to securely prevent an increase in spots of devitrification and obtain a more favorable single crystal yield.

In addition, a method for manufacturing a silica glass crucible according to the present invention includes a process for depositing a first natural silica powder a first onto approximately the entire inner surface of a rotating mold, a process for depositing a synthetic silica powder onto approximately an entire inner surface of a layer formed by the first natural silica powder, a process for selectively depositing a second natural silica powder onto at least one part of a bottom part of the inner surface of a layer formed by the synthetic silica powder, and a process for forming a silica glass crucible including a first natural silica glass layer formed on the entire inner surface of the mold, a synthetic silica glass layer formed on the entire inner surface of the first natural silica glass layer, and a second natural silica glass layer formed in a region which includes the center of the bottom part of the inner surface of the synthetic silica glass layer, by melting the first natural silica powder, the synthetic silica powder and second natural silica powder, wherein the concentration of Ca included in the second natural silica powder is 0.5 ppm or less.

In addition, a method for manufacturing a silica glass crucible according to the present invention includes a process for creating a basic structure of a silica glass crucible having a first natural silica glass layer which forms an outer layer in a wall part and a bottom part, and a synthetic silica glass layer which forms an inner layer in the wall part and the bottom part, and a process for forming by a thermal splaying process a second natural silica glass layer on at least one part of an inner surface of a bottom part of the basic structure of the silica glass crucible, wherein a Ca concentration of a natural silica powder which becomes the raw material for the natural silica glass layer is 0.5 ppm or less.

Furthermore, a method for manufacturing a silica glass crucible according to the present invention includes a process for depositing a natural silica powder on an inner surface of a rotating mold, a process for depositing a synthetic silica powder on an inner surface of the layer formed by the natural silica powder, and a process for forming a silica glass crucible having a natural silica glass layer formed on the entire inner surface of the mold, and a synthetic silica layer formed on a region except a region which includes the center of a bottom part of an inner surface of the natural silica glass layer, by melting the natural silica powder and the synthetic silica powder, wherein a concentration of Ca included in the natural silica powder is 0.5 ppm or less, and a concentration of Al included in the natural silica powder is 29 ppm or less.

A method for manufacturing a silicon single crystal of the present invention including preparing a silica glass crucible having a wall part and a bottom part, at least one part of an inner surface of the bottom part formed by a natural silica glass and at least the inner surface of the wall part formed by a synthetic silica glass, wherein a concentration of Ca included in the natural silica glass is 0.5 ppm or less is prepared, a process for filling the interior of the silica glass crucible with polysilicon, a process for melting the polysilicon within the silica glass crucible, and a process for pulling up a silicon single crystal from a silicon melt within the silica glass crucible, wherein the process for pulling up the silicon single crystal includes a process which begins pulling up a straight body part of the silicon single crystal after 30 μm or more of the natural silica glass which is exposed on at least one part of an inner surface of the bottom part of the crucible is melted.

The present invention can provide a silica glass crucible for pulling up a silicon single crystal and which can prevent the generation of cavity defects caused by incorporation of gas bubbles with the silicon single crystal.

In addition, the present invention can provide a manufacturing method of a silica glass crucible which can manufacture a high quality silicon single substrate with no cavity defects.

Furthermore, the present invention can provide a manufacturing method of a high quality silicon single substrate with no cavity defects.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENT

Preferred embodiments of the present invention will now be described in detail hereinafter with reference to the accompanying drawings.

Figure 1:
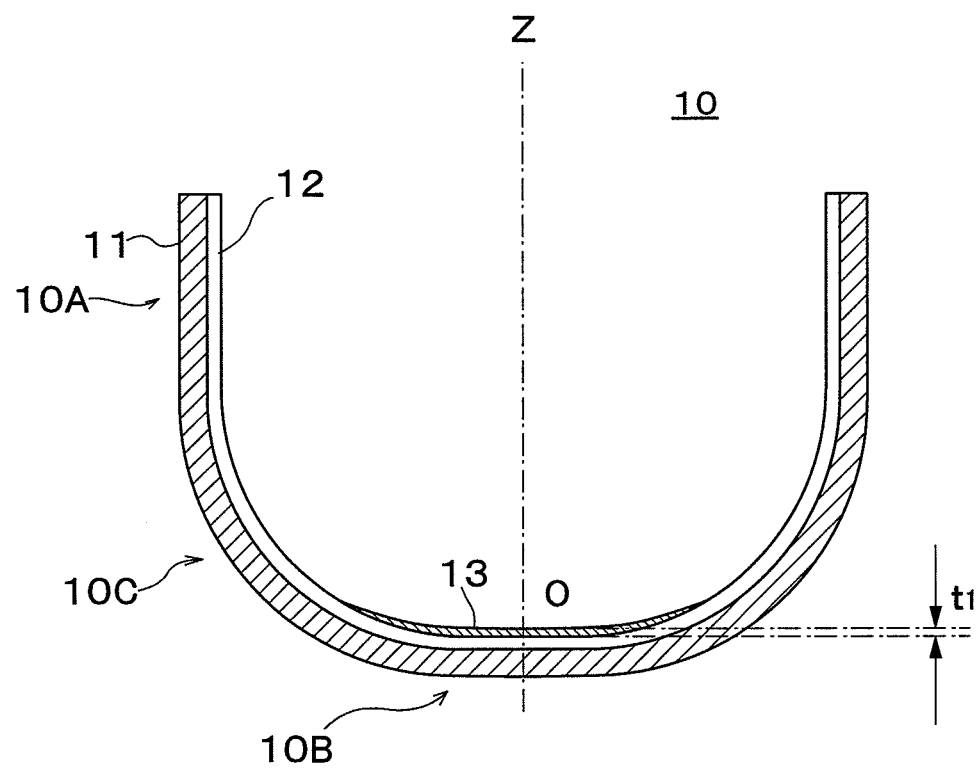
FIG. 1 is a schematic cross sectional view which shows a structure of a silica glass crucible for pulling up a silicon single crystal according a first embodiment of the present invention.

FIG. 1 is a schematic cross sectional view which shows a structure of a silica glass crucible for pulling up a silicon single crystal according to a first embodiment of the present invention.

As is shown in FIG. 1, a silica glass crucible has a two layer structure comprised of a first natural silica glass layer 11 which forms a an outer layer of a crucible and a synthetic silica glass layer 12 which forms an inner layer of the crucible. Furthermore, a second natural silica glass layer 13 is formed on the inner surface of a bottom part 10B of the crucible. As a result, a wall part 10A and a corner part 100 of the crucible form the two layer structure, and the bottom part 10B of the crucible forms a three layer structure.

The first natural silica glass layer 11 is an amorphous silica glass layer with a natural silica powder as the raw material and is arranged over the entire silica glass crucible 10 from the wall part 10A to the bottom part 10B. Generally, natural silica has a higher concentration of metallic impurities than synthetic silica and also has a low concentration of an OH group. For example, the concentration of Al included in natural silica is 1 ppm or more, the concentration of an alkali metal (Na, K and Li) are each 0.05 ppm or more and the concentration of an OH group is below 50 ppm. In addition, natural silica also shows different characteristics to synthetic silica with respect to an X-ray diffraction measurement etc. Furthermore, whether a natural silica glass layer or not should not be judged on the basis of one element but should be judged as a whole on the basis of a plurality of elements. Because the first natural silica glass layer 11 has a higher viscosity at high temperatures compared to the synthetic silica glass layer 12, it is possible to increase the heat resistance strength of the entire crucible. In addition, natural silica is cheaper than synthetic silica making it advantageous in terms of costs.

The synthetic silica glass layer 12 is an amorphous silica glass layer with a synthetic silica powder as the raw material and is arranged over the entire silica glass crucible 10 from the wall part 10A to the bottom part 10B the same as the first natural silica glass layer 11. A synthetic silica glass having a high level of purity synthesized by hydrolysis of silicon alkoxide can be given as an example of synthetic silica. Generally, synthetic silica has a lower concentration of metallic impurities than natural silica and also has a high concentration of an OH group. For example, the concentration of each metallic impurity included in synthetic silica is below 0.05 ppm, and the concentration of an OH group is 50 ppm or more. Furthermore, whether a synthetic silica glass layer or not should not be judged on the basis of one element but should be judged as a whole on the basis of a plurality of elements. Because the synthetic silica glass layer 12 has few impurities compared to the first natural silica glass layer 11, it is possible to prevent an increase in impurities eluted to the silicon melt from the crucible and it is also possible to increase the silicon single crystal yield.

The second natural silica glass layer 13 is also an amorphous silica glass layer with a natural silica powder as the raw material and is selectively formed on the inner surface of the bottom part 10B of the silica glass crucible 10. The second natural silica glass layer 13 is not arranged on the wall part 10A and corner part 100 of the silica glass crucible 10. Therefore, on the inner surface of the silica glass crucible 10, the synthetic silica glass layer 12 is exposed on the wall part 10A and corner part 10C. The second natural silica glass layer 13 plays the role of removing fine damage formed on the inner surface of the crucible bottom part 10B, in the time period from the polysilicon melting process up to the start of pulling up a seed crystal.

It is preferred that the vicinity of the inner surface of the silica glass crucible 10 be comprised of a transparent layer which essentially does not include bubbles and it is preferred that an area further exterior to the transparent layer be comprised of an opaque layer including many microscopic bubbles. In the case where the inner surface of the crucible is comprised of a transparent layer, it is possible to prevent an increase in silica fragments which peel off from the inner surface of the crucible, and increase the silicon single crystal yield. In addition, in the case where the exterior of the crucible is comprised of an opaque layer, it is possible to increase the heat capacity of the crucible and temperature control of the silicon melt becomes easier.

"Essentially does not include bubbles" means that the bubble containing ratio is 0.1% or less and the average diameter of the bubbles is 100 μm or less. Here, the bubble containing ratio is defined as the ratio $(W_2/W_1)$ of a bubble occupied area $(W_2)$ with respect to a unit of area $(W_1)$. It is preferred that the thickness of the transparent layer be 1.0 mm or more. This is because while the inner surface of the crucible is dissolved around 0.3-1.0 mm when pulling up the silicon single crystal, when the transparent layer is thinner than 1.0 mm, the inner surface is completely dissolved when pulling up the silicon single crystal and the opaque layer may be exposed. The bubble containing ratio of the opaque layer is preferred to be 0.7-2% and the average diameter of the bubbles to be around 100 μm.

Because the second natural silica glass layer 13 is completely dissolved when then silicon single crystal is pulled up, it is necessary to form the entire layer as a transparent layer. In addition, while it is preferred that the entire synthetic silica glass layer 12 be formed as a transparent layer, it may also be formed as a two layer structure with the interior being a transparent layer and the exterior being an opaque layer. When the entire synthetic silica glass layer 12 is formed as a transparent layer, it is preferred that the entire first natural silica glass layer 11 be formed as an opaque layer. However, the first natural silica glass layer 11 may also be formed as a two layer structure with the interior being a transparent layer and the exterior being an opaque layer. In addition, when the synthetic silica glass layer 12 is formed as a two layer structure as described above, the entire first natural silica glass layer 11 is formed as an opaque layer. In this way, a border between the first natural silica glass layer 11 and the synthetic silica glass layer 12 and a border between the transparent layer and opaque layer do not always match. In addition, the thickness of the transparent layer differs depending on the site of the crucible.

The crucible wall part 10A is a cylindrical part which is parallel to the center axis (Z axis) of the crucible and extends approximately directly down from the opening of the crucible. The wall part 10A does not have to be completely parallel with respect to the Z axis and may incline so that it gradually widens towards to the opening. In addition, the wall part 10A may be a straight line or may curve smoothly.

The crucible bottom part 10B is the roughly disk shaped part which includes the intersection point O with the crucible Z axis and the corner part 100 is formed between the bottom part B and the wall part 10A. The shape of the crucible bottom part 10B may be a round bottom or a flat bottom. In addition, it is possible to arbitrarily set the curvature and angle of the corner part 10C. When the crucible bottom part 10B is a round bottom, because the bottom part 10B has adequate curvature, the difference in curvature between the bottom part 10B and the corner part 10C is much smaller than a flat bottom. In the case where the crucible bottom part 10B is a flat bottom, the bottom part 10B has an even or extremely moderate curved surface and the curvature of the corner part 100 is very large. Furthermore, the bottom part 10B can be defined as a region in which the tangent angle of inclination of a crucible wall surface with respect to a flat surface XY which intersects the Z axis is 30° or less.

Fine damage with a depth of around 50-100 μm exists in the inner surface of the crucible. This fine damage is generated when manufacturing the crucible and may also be produced when loading polysilicon into the crucible or by contact the polysilicon and the inner surface of the crucible when melting of the polysilicon begins. When this kind of fine damage exists, SiO gas is produced due to the fine damage and the SiO gas rises up in the silicon melt and becomes incorporated into the silicon single crystal causing cavity defects.

However, in the case where the inner surface of the bottom part 10B of the crucible is formed by the second natural silica glass layer 13, it is possible to quickly remove the fine damage (at an early stage) while melting the natural silica glass layer 11. The melting speed of natural silica is higher than synthetic silica, for example, when the temperature of the silicon melt is 1500° C. the melting speed of synthetic silica is 2-6 um/hr and the melting speed of natural silica is 8-12 μm/hr. Although the reason why the melting speed of natural silica is higher compared to the synthetic silica is unclear, it is assumed that it is due to impurities within the silica glass. In this way, because the melting speed of natural silica into the silicon melt is higher compared to synthetic silica, fine damage which exists in the surface of the second natural silica glass layer 13 is removed or significantly reduced by melting up to the point of actually pulling up the silicon single crystal. Therefore, it is possible to control the production of SiO gas caused by fine damage.

The inner surface of the wall part 10A and the corner part 10C of the silica glass crucible 10 is formed by the synthetic silica glass layer 12. As a result, fine damage which is formed in the inner surface of the wall part 10A and corner part 100 is not removed at an early stage and continues to exist even when pulling up the silicon single crystal. However, the possibility that bubbles of SiO gas which is produced from this fine damage are incorporated into the silicon single crystal is extremely low. This is because the convection speed of the silicon melt is only as few mm/sec while the ascent speed of SiO gas within the silicon melt is 30-60 cm/sec, and the bubbles of SiO gas does not flow with the convection but rises in the silicon melt almost perpendicularly.

Therefore, the fine damage in the wall part 10A and the corner part 10C does not become the cause for cavity defects. Rather, in the case where the entire inner surface of the crucible is formed by the second natural silica layer 13, impurities which elute into the silicon melt increase, and cause a decrease of the silicon single crystal yield. For these reasons, in the present embodiment, the second natural silica glass layer 13 is formed only on the inner surface of the bottom part 10B and the synthetic silica glass layer 12 is exposed on the wall part 10A and the corner part 10C. However, in the present invention, it is not essential to expose the synthetic silica glass layer 12 of the corner part 10C, it is sufficient to expose the synthetic silica glass layer 12 on at least wall part 10A.

It is necessary that the concentration of calcium (Ca) in the second natural silica glass layer 13 be 0.5 ppm or less. Ca, one of the impurities of the natural silica, is mainly included as calcium oxide (CaO). When the concentration of Ca at an element level exceeds 0.5 ppm, points of devitrification caused by local crystal growth (Cristobalite) increase rapidly and as a result lead to a drop in the single crystal yield. Furthermore, the concentration of Ca in the second natural silica glass layer 13 is preferred to be 0.4 ppm or less. If the concentration of Ca is 0.4 ppm or less, it is possible to obtain an even higher single crystal yield.

Because the first natural silica glass layer 11 does not form the inner surface of the crucible, the concentration of Ca is not particularly limited. Therefore, the concentration of Ca of the first natural silica glass layer 11 may be 0.5 ppm or less or may exceed 0.5 ppm.

It is preferred that the thickness of the crucible be around 8-30 mm. Of that, the thickness of the first natural silica glass layer 11 is not particularly limited as long as mechanical strength of the crucible can be secured, but is preferred to be around 7-29 mm. The thickness of the first natural silica glass layer 11 may be uniform and may be different to the thickness of the wall part 10A and bottom part 10B.

The thickness of the synthetic silica glass layer 12 is required to be 1.0 mm or more. As stated above, the inner surface of the crucible is dissolved around 0.3-1.0 mm when pulling up the silicon single crystal. However, when the synthetic silica glass layer 12 is thinner than 1.0 mm, the synthetic silica glass layer 12 is completely dissolved when pulling up the silicon single crystal and the natural silica glass layer 11 may become exposed.

The thickness $t_1$ of the second natural silica glass layer 13 is defined as the thickness in the position where the center axis Z passes through the crucible bottom part 10B. The thickness at this position is the thickest part of the second natural silica glass layer 13. The thickness $t_1$ of the second natural silica glass layer 13 is required to be 30 µm or more and 200 µm or less. When the thickness $t_1$ of the second natural silica glass layer 13 is less than 30 µm, fine damage at the bottom part 10B of the silica glass crucible can not be sufficiently removed or reduced and the generation of SiO gas from the bottom part 10B can not be sufficiently controlled. When the thickness $t_1$ of the second natural silica glass layer 13 is larger than 200 µm, the impurities which elute into the silicon melt increase causing a drop in the silicon single crystal yield.

Furthermore, it is more preferable if the thickness $t_1$ of the second natural silica glass layer 13 is 50 µm or more and 100 µm or less. This is because the depth of the fine damage which is the cause of the generation of SiO gas, is around 50-100 µm, and if the thickness $t_1$ of the second natural silica glass layer 13 is set at the above stated range, fine damage at the bottom part 10B of the silica glass crucible can be almost completely removed. Moreover, because the thickness of the second natural silica glass layer 13 is not thicker than is necessary, it is possible to control the elution of impurities into the silicon melt and increase the silicon single crystal yield.

Figure 2:
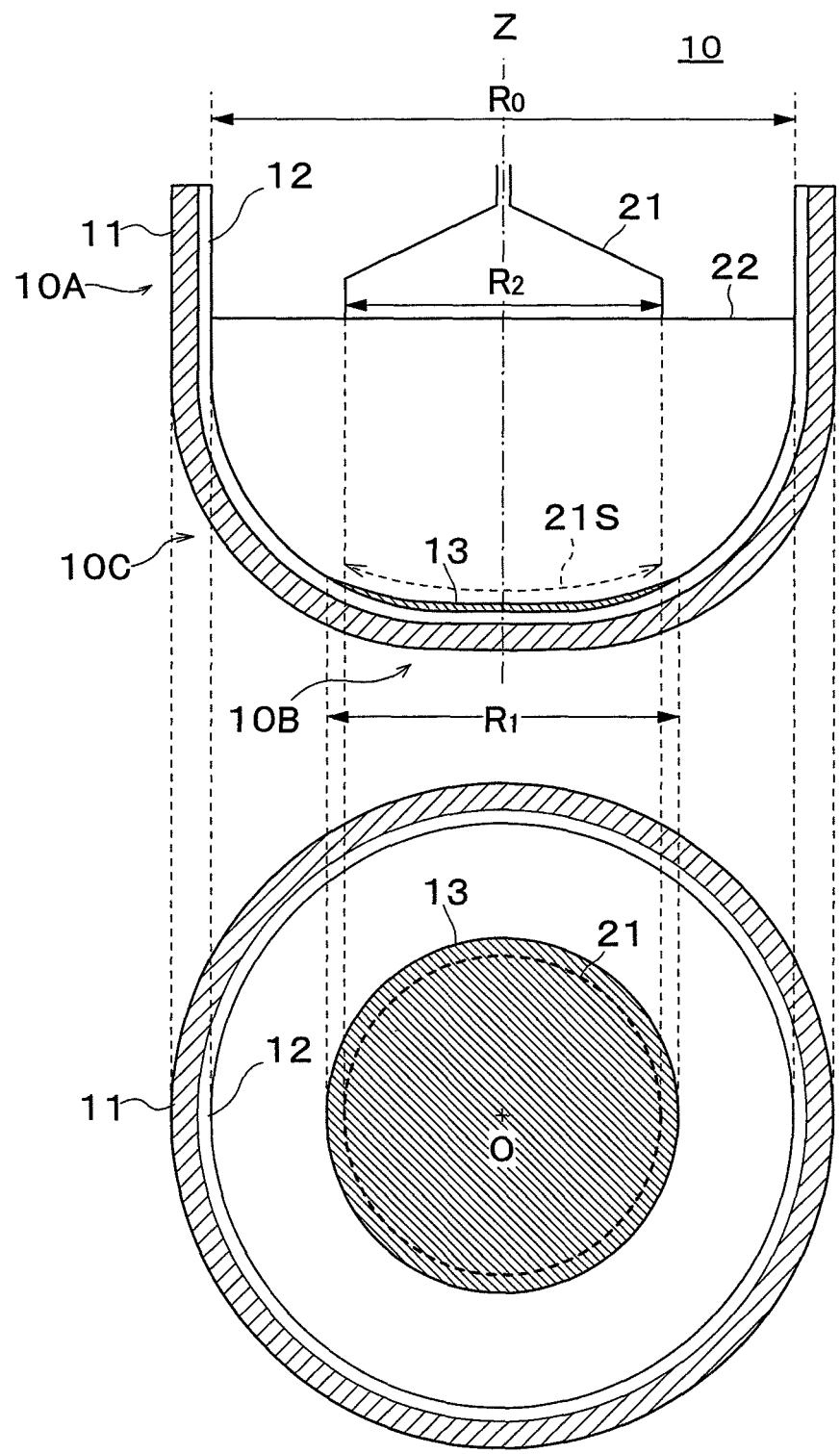
FIG. 2 is a cross sectional and planar view diagram which shows a positional relationship between the silica glass crucible and a silicon single crystal.

FIG. 2 is a cross sectional and planar view diagram which shows a positional relationship between the silica glass crucible 10 and a silicon single crystal 21.

As is shown in FIG. 2, the shape of the flat region of the second natural silica glass layer 13 seen from the Z axis direction is a round shape with the intersection point O with the Z axis at the center, and its diameter $R_1$ is more preferably equal to or more than a diameter $R_2$ of the silicon single crystal which is pulled up. In other words, it is preferred that the flat region of the second natural silica glass layer 13 covers the projection plane of 21S of the silicon single crystal 21. Furthermore, the diameter $R_2$ of the silicon single crystal is a few mm to tens of mm larger than the diameter of the final silicon wafer product.

The diameter $R_2$ of the silicon single crystal 21 is not principally determined by the shape or size of the silica glass crucible 10. However, it is significantly dependent on the diameter $R_0$ of the silica glass crucible 10. If the crucible diameter $R_0$ is too small with respect to the silicon single crystal diameter $R_2$, crystal quality control such as oxygen concentration and oxygen in-plane distribution of the single crystal becomes difficult, and if it is too large costs increase because it becomes necessary to increase the size of devices and components. Therefore, the diameter $R_2$ of the silicon single crystal 21 is usually set at $0.3R_0$-$0.6R_0$.

Considering such points, it is preferred that the diameter $R_1$ of the flat region of the second natural silica glass layer 13 be $0.3R_0$ or more and $0.6R_0$ or less with respect to the diameter $R_0$ of the silica glass crucible. This is because when the diameter $R_1$ of the flat region of the second natural silica glass layer 13 is smaller than $0.3R_0$, the projection plane 21S of the silicon single crystal 21 can not be covered and the possibility that the bubbles of the SiO gas which is produced from the synthetic silica glass layer 12 are incorporated into the silicon single crystal increases. When the diameter $R_1$ of the flat region of the second natural silica glass layer 13 is larger than $0.6R_0$, the projection plane 21S of the silicon single crystal 21 can be securely covered but impurities which elute into the silicon melt 22 increase and cause a decrease in the silicon single crystal yield.

Next, the diameter $R_1$ of the flat region of the second natural silica glass layer 13 will be explained in detail. For example, in the case of pulling up a roughly 300 mm diameter silicon single crystal using a 32 inch (diameter $R_0$=800 mm) silica glass crucible, the minimum diameter $R_1$ of a round shaped region of the second natural silica glass layer 13 formed on the bottom 10B of the crucible becomes $0.3R_0$=240 mm, and the maximum is $0.6R_0$=480 mm. Usually, a 32 inch crucible is used for pulling up a roughly 300 mm diameter silicon single crystal and the diameter $R_1$ of the flat region of the second natural silica glass layer 13 in this case is preferably around 300 mm, and this value meets the above stated conditions 240 mm or more and 480 mm or less. In this way, if the diameter $R_1$ of the flat region of the second natural silica glass layer 13 is $0.3R_0$ or more and $0.06R_0$ or less, there is almost no decrease in the single crystal yield and it is possible to effectively control the generation of gas bubbles of the SiO gas which are possibly incorporated into the silicon single crystal during the process of being pulled up.

As stated above, the gas bubbles of the SiO gas rise almost perpendicularly, and the gas bubbles which are generated further to the exterior (the region in which the second natural silica glass layer 13 is not formed) of the projection plane 21S of the silicon single crystal 21 during the process of being pulled up, for some reason, rise while shifting slightly in a horizontal direction, and as a result may be incorporated into the silicon single crystal 21. However, the position of such gas bubbles is in the vicinity of the periphery of the silicon single crystal 21 and because the vicinity of the periphery of the silicon single crystal is later ground as an unnecessary part, no problem is cause if the gas bubbles are incorporated.

As explained above, in the silica glass crucible 10 of the present embodiment, because the natural silica glass layer 13 is formed with a certain thickness on the inner surface of the crucible bottom part 10B, it is possible to remove fine damage in the inner surface of the crucible bottom part 10B within the short time from a polysilicon melting process up to the start of pulling up the single crystal. Therefore, it is possible to control the generation of SiO gas caused by damage in the crucible inner surface and prevent the generation of cavity defects within the silicon single crystal.

Next, a manufacturing method of the silica glass crucible 10 will be explained while referring to the flow chart in FIG. 3.

The silica glass crucible 10 can be manufactured by a rotating mold method. In the rotating mold method, natural silica powder (first natural silica powder) which is the raw material for the first natural silica glass layer 11 is deposited to a certain thickness on an inner surface of a rotating carbon mold (step S11). Then, a synthetic silica power which is the raw material for the synthetic silica glass layer 12 is deposited at a certain thickness on the inner surface of the layer formed by the first natural silica powder (step S12). Furthermore, a natural silica powder (second natural silica powder) which is the raw material for the second natural silica glass layer 13 is deposited at a certain thickness on the bottom part of the inner surface of the layer formed by the synthetic silica powder (step S13). At this time, the second natural silica powder is deposited only on the bottom part of the layer formed by the synthetic silica powder and is not deposited on the wall part.

The Ca concentration of the second natural silica powder used at this time is preferably lower than the Ca concentration of the first natural silica powder and is required to be 0.5 ppm or less. The Ca concentration of the first natural silica powder is not particularly limited and may be 0.5 ppm or more. The area (diameter) and thickness of the second natural silica glass layer 13 can be adjusted by the fill position and fill weight of the second natural silica powder, and can also be adjusted by the rotation speed of the mold. Because it is sufficient to form the second natural silica glass layer 13 only on the crucible bottom part 10B, the fill weight of the natural silica powder for achieving this may be less than the when forming the first natural silica glass layer 11.

Following this, the entire inner surface of the silica powder is heated to 1720° C. or more from the interior of the mold by a discharge heat due to an arc electrode which is arranged on the center upper part of the mold and the silica powder is arc melted (step S14). In addition, at the same time as this heating, pressure decreases from the mold side, gas within the melt silica is sucked to the outer layer side via a vent arranged in the mold, and by discharging the gas to the outside via the vent the gas bubbles of the crucible inner surface are partially removed and a transparent layer is formed with essentially no gas bubbles. Following this, the pressure is weakened or stopped and an opaque layer is formed including multiple tiny gas bubbles by continuing heating further and forcing the gas bubbles to remain.

By the above, the silica glass crucible 10 which is arranged with the first natural silica glass layer 11 which forms the outer layer in the bottom part and wall part of the crucible, the synthetic silica glass layer 12 which forms the inner surface in the crucible wall part, and the second silica glass layer 13 which forms the inner surface in crucible bottom part, is completed.

The second natural silica glass layer 13 of the silica glass crucible 10 can also be manufactured by what is called thermal spraying. Specifically, after creating the basic structure of the silica glass crucible which is comprised of the first natural silica glass layer 11 and the synthetic silica glass layer 12 by an arc melting process, the natural silica powder is thermal sprayed onto the inner surface of this silica glass crucible bottom part and the second natural silica glass layer 13 is formed. At this time, a natural silica powder with a Ca concentration of 0.5 ppm or less is used as a raw material. In this way, it is possible to manufacture the silica glass crucible 10 of the present embodiment by additional processing of the existing two layer structured silica glass crucible.

Figure 4:
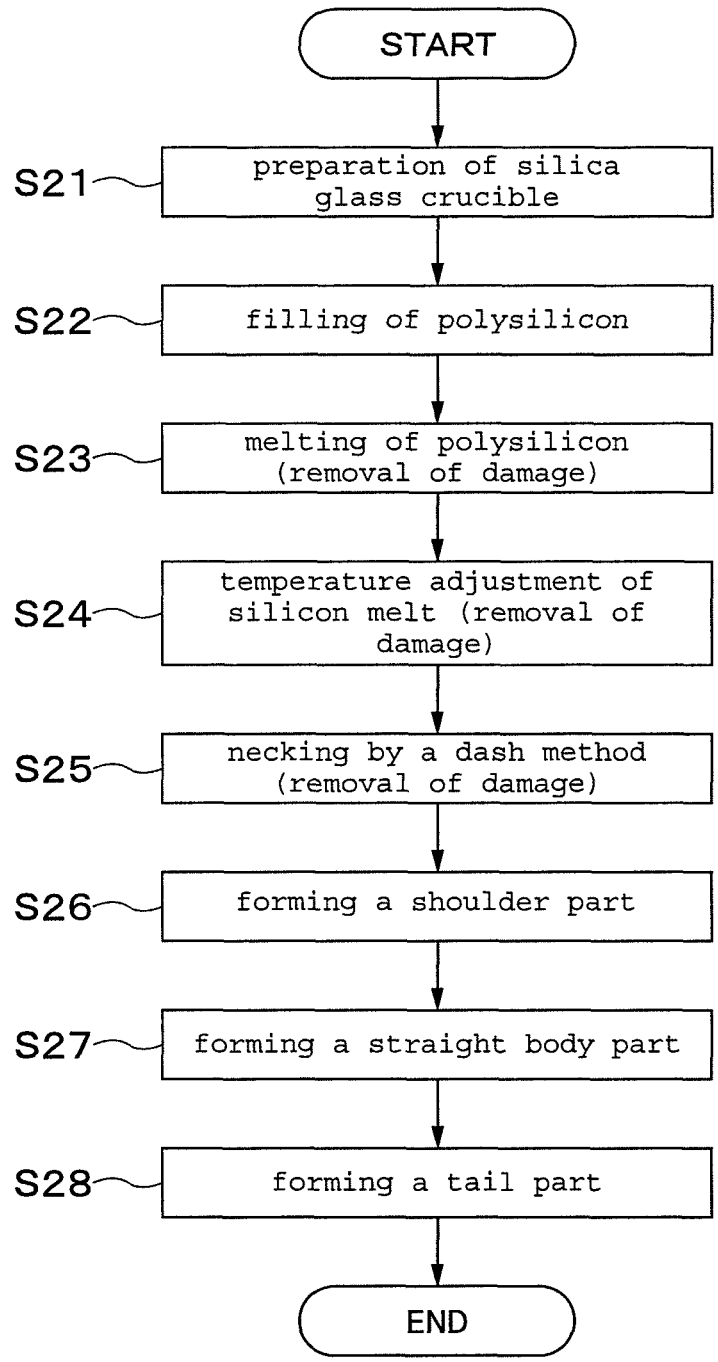
FIG. 4 is a flow chart which shows a manufacturing method of a silicon single crystal using a silica glass crucible according to the first embodiment of the present invention.

Next, the manufacturing method of a silicon single crystal using the silica glass crucible 10 will be explained while referring to the flow chart in FIG. 4.

Figure 3:
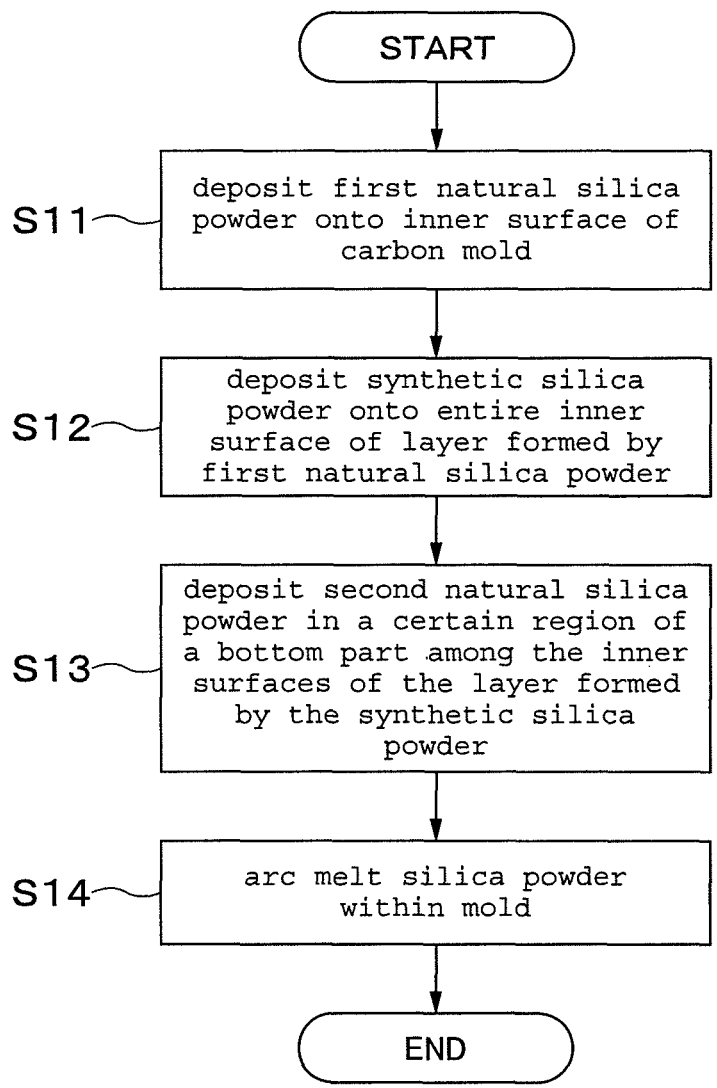
FIG. 3 is a flow chart which shows a manufacturing method of a silica glass crucible for pulling up a silicon single crystal according to the first embodiment of the present invention.

First, the silica glass crucible 10 manufactured by the method shown in FIG. 3 is prepared (step S21), and polysilicon particles which become the raw material of the silicon single crystal are filled into the crucible (step S22). At this time, fine damage sometimes occurs in the inner surface of the silica glass crucible 10 due to the weight of the polysilicon particles.

Next, the silica glass crucible is loaded onto a single crystal pulling up device and the polysilicon filled into the silica glass crucible 10 is melted by heating using a heater (step S23). The inner surface of the silica glass crucible 10 also gradually melts at the same time as melting the polysilicon with this heating. As stated above, because the melting speed of the natural silica glass is higher than the synthetic silica glass, melting occurs mainly at the second natural silica glass layer 13 and fine damage which is produced on the bottom surface of the silica glass crucible 10 becomes gradually shallower. However, fresh damage sometimes occurs on the inner surface of the silica glass crucible due to the weight or collapse of the polysilicon during melting. In this way, the interior of the silica glass crucible 10 is filled up with the silicon melt.

Next, after adjusting the temperature until the silicon melt is stable at around 1500° C. (step S24) the silicon single crystal is pulled up (step S25-S28). In the silicon single crystal pulling up process, after a seed crystal is immersed into the silicon melt and a neck part is formed by a dash method (step S25), a shoulder part, straight body part and tail part of the silicon single crystal are formed in sequence (step S26-S28). The second natural silica glass layer 13 is gradually melted during temperature adjustment of the silicon melt or during the silicon single crystal pulling up process and fine damage which occurs on the bottom surface of the silica glass crucible 10 is removed. Because the depth of the fine damage is 50-100 μm and the melting speed of the natural silica glass is 8-12 μm/hr, a significant part of the fine damage is removed when around 4-12 hours have elapsed.

Consequently, in order to effectively prevent the production of cavity defects, if the depth (50-100 µm) of fine damage which occurs at the bottom part of the silica glass crucible 10 and the thickness (30 µm-200 µm) of the second silica glass layer 13 are considered, control is necessary so that the amount of time taken from the start of melting the polysilicon until the formation of the shoulder part, exceeds 4-12 hours, and after melting 30 µm or more of the surface of the second natural silica glass layer 13, it is necessary to start pulling up the straight body part of the silicon single crystal.

In this way, in the present embodiment, because the straight body part of the silicon single crystal is pulled up after removing or sufficiently reducing the fine damage which exists in the inner surface of the bottom surface of the silica glass crucible 10, it is possible to pull up the silicon single crystal in a state with almost no damage on the projection plane of the silicon single crystal. As a result, it is possible to prevent the generation of SiO gas caused by the fine damage and effectively prevent the generation of cavity effects due to the SiO gas. Furthermore, impurities are eluted due to melting of the natural silica glass layer 13. However, because the benefits of preventing cavity defects are much larger compared to the bad effects caused by elution of impurities, significant effects can be obtained in the manufacture of the silicon single crystal.

Next, the second embodiment of the present invention will be explained in detail.

Figure 5:
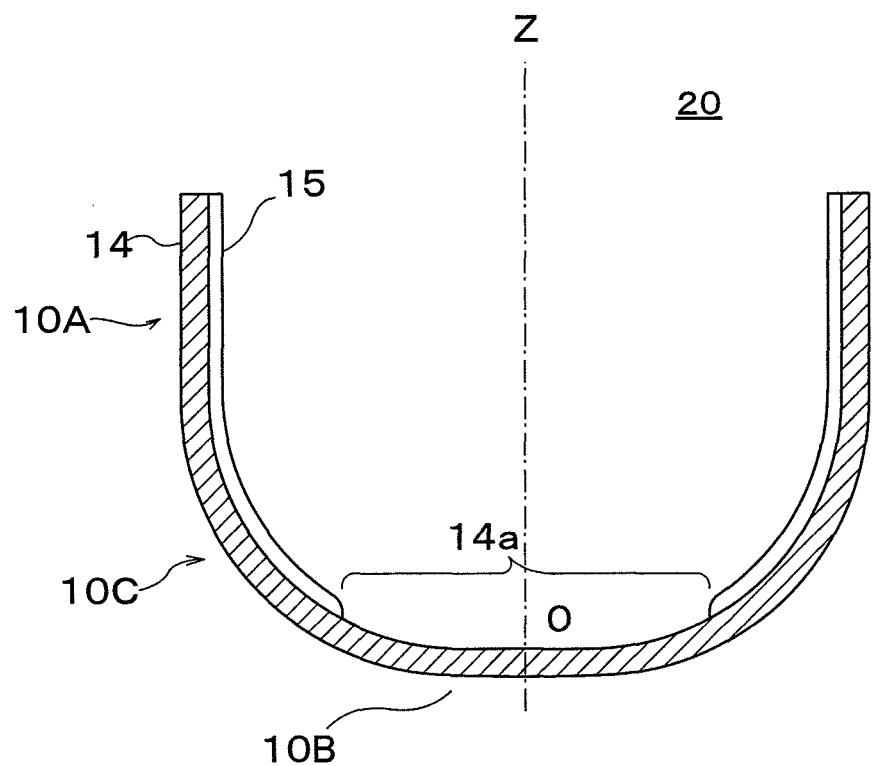
FIG. 5 is a schematic cross sectional view which shows the structure of a silica glass crucible for pulling up a silicon single crystal according to a second embodiment of the present invention.

FIG. 5 is a schematic cross sectional view which shows a structure of a silica glass crucible for pulling up a silicon single crystal according to the second embodiment of the present invention.

As is shown in FIG. 5, a silica glass crucible 20 includes a natural silica glass layer 14 which forms an outer layer and a synthetic silica glass layer 15 which forms an inner layer in a wall part 10A and a corner part 10C of the crucible. The natural silica glass layer 14 is arranged over the entire silica glass crucible 20 from the wall part 10A to a bottom part 10B but is not formed on the bottom part 10B of the synthetic silica glass layer 15. As a result, there is two layer structure in the wall part 10A of the crucible and a single layer structure in the bottom part 10B of the crucible.

The natural silica glass layer 14 is an amorphous glass layer with natural silica as the raw material and the synthetic silica glass layer 15 is an amorphous silica glass layer with synthetic silica as the raw material. Because the synthetic silica glass layer 15 is arranged in a region which excludes a certain range from the bottom part 10B of the crucible, the natural silica glass layer 14 is exposed on the bottom part 10B and forms the inner surface of the bottom part 10B. An exposed region 14a of the natural silica glass layer 14 plays the role of removing fine damage formed on the inner surface of the crucible bottom part 10B, in the time period from the polysilicon melting process up to the start of pulling up a seed crystal.

It is preferred that the vicinity of the inner surface of the silica glass crucible 20 be comprised regardless of the natural silica glass layer or synthetic silica glass layer, of a transparent layer which essentially does not include gas bubbles and it is preferred that an area further exterior to the transparent layer be comprised of an opaque layer including multiple tiny gas bubbles. In the case where the inner surface of the crucible is comprised of a transparent layer, it is possible to prevent an increase in silica fragments which peel off from the inner surface of the crucible, and increase the silicon single crystal yield. In addition, in the case where the exterior of the crucible is comprised of an opaque layer, it is possible to increase the heat capacity of the crucible and temperature control of the silicon melt becomes easier.

It is required that the thickness of a transparent layer be 1.0 mm or more. As stated above, this is because while the inner surface of the crucible is dissolved around 0.3-1.0 mm when pulling up the silicon single crystal, when the transparent layer is thinner than 1.0 mm, the transparent layer is completely dissolved when pulling up the silicon single crystal and the opaque layer may be exposed. When the opaque layer is exposed, the gas bubbles include in the opaque layer partially peel away inner surface of the crucible and the peeled off silica fragments become mixed with the single crystal and cause a decrease in the rate of single crystallization.

A depth of around 50-100 µm of fine damage exists in the inner surface of the crucible. This fine damage is generated when manufacturing the crucible and may also be produced when charging polysilicon into the crucible or by contact the polysilicon and the inner surface of the crucible when melting of the polysilicon begins. When this kind of fine damage exists, SiO gas is produced due to the fine damage and the SiO gas rises up in the silicon melt and becomes incorporated into the silicon single crystal causing cavity defects.

However, in the case where the inner surface of the bottom part 10B of the crucible is formed by the natural silica glass layer 14, it is possible to quickly remove the fine damage at an early stage while melting the natural silica glass layer 14. As already explained, because the melting speed of natural silica is higher than synthetic silica, fine damage which exists in the surface of the natural silica glass layer 14 is removed or significantly reduced by melting up to the point of actually pulling up the silicon single crystal. Therefore, it is possible to control the production of SiO gas caused by fine damage.

The inner surface of the wall part 10A and the corner part 100 of the silica glass crucible 20 is formed by the synthetic silica glass layer 15. As a result, damage which is formed in the inner surface of the wall part 10A and corner part 100 is not removed at an early stage and continues to exist even when pulling up the silicon single crystal. However, the possibility that gas bubbles of SiO gas which is produced from this fine damage are incorporated into the silicon single crystal is extremely low, as explained in the first embodiment.

Therefore, the fine damage in the wall part 10A and the corner part 10C does not become the cause for cavity defects. Rather, in the case where the entire inner surface of the crucible is formed by the natural silica glass layer 14, impurities which elute into the silicon melt increase, and cause a decrease of the silicon single crystal yield. For these reasons, in the present embodiment, the wall part 10A and the corner part 10C are formed by the synthetic silica glass layer 15 and only the natural silica glass layer 14 of the bottom part 10B is exposed. However, in the present invention, it is not essential to arrange the synthetic silica glass layer 15 on both the wall part 10A and the corner part 10C, it is sufficient to arrange the synthetic silica glass layer 15 on at least wall part 10A.

It is necessary that the concentration of calcium (Ca) in the natural silica glass layer 14 be 0.5 ppm or less. Ca, one of the impurities of natural silica is mainly included as calcium oxide (CaO). When the concentration of Ca at an element level exceeds 0.5 ppm, points of devitrification caused by local crystal growth increase rapidly and as a result, lead to a drop in the single crystal yield. Furthermore, the concentration of Ca in the natural silica glass layer 14 is preferred to be 0.4 ppm or less. If the concentration of Ca is 0.4 ppm or less, is possible to obtain an even higher single crystal yield.

It is necessary that the concentration of aluminum (Al) in the natural silica glass layer 14 be 20 ppm or less. Aluminum, one of the impurities of natural silica, is mainly included as aluminum oxide ($Al_2O_3$). When the concentration of Al at an element level exceeds 20 ppm, points of devitrification caused by local crystal growth increase rapidly and as a result, lead to a drop in the single crystal yield. Furthermore, the concentration of Al in the natural silica glass layer 14 is preferred to be 10 ppm or less. If the concentration of Ca is 10 ppm or less, is possible to obtain an even higher single crystal yield.

It is preferred that the thickness of the crucible be around 8-30 mm. Of that, the thickness of the natural silica glass layer 14 is not particularly limited as long as mechanical strength of the crucible can be secured, but is preferred to be around 7-29 mm. The thickness of the natural silica glass layer 14 may be uniform and may be different to the thickness of the wall part 10A and bottom part 10B. Furthermore, while the inner surface of the crucible is usually dissolved around 0.3-1.0 mm during the pulling up process of the silicon single crystal, this amount of loss does not affect the strength of the crucible.

The thickness of the synthetic silica glass layer 15 is required to be 1.0 mm or more. As stated above, the inner surface of the crucible is dissolved around 0.3-1.0 mm when pulling up the silicon single crystal, and when the synthetic silica glass layer 15 is thinner than 1.0 mm, the synthetic silica glass layer 15 is dissolved completely when pulling up the silicon single crystal and the natural silica glass layer 14 may become exposed.

Figure 6:
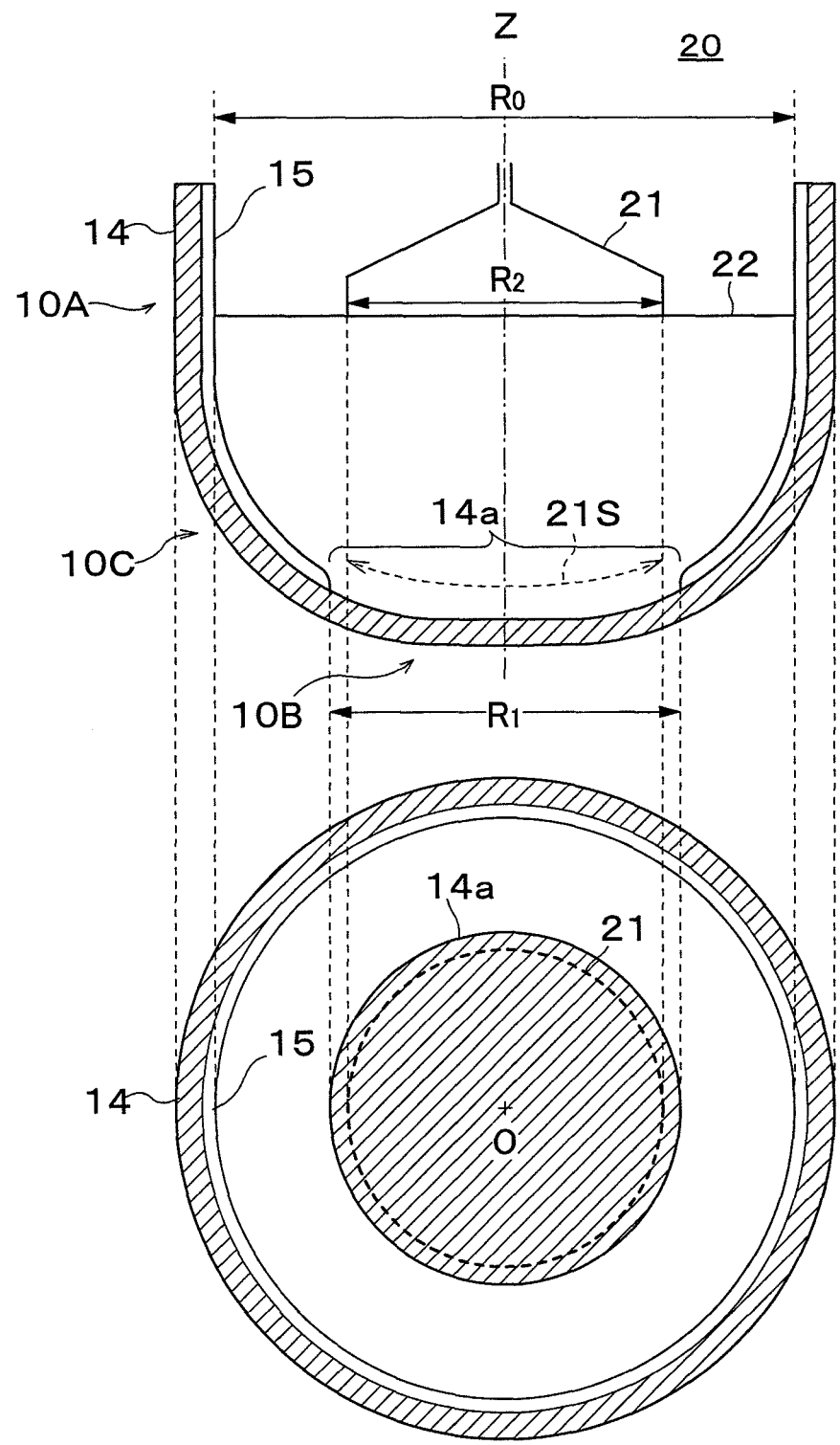
FIG. 6 is a cross sectional and planar view diagram which shows a positional relationship between the silica glass crucible and a silicon single crystal.

FIG. 6 is a cross sectional and planar view diagram which shows a positional relationship between the silica glass crucible 20 and a silicon single crystal 21.

As is shown in FIG. 6, the shape of the exposed region 14a of the natural silica glass layer 14 seen from the Z axis direction is a round shape with an intersection point with the Z axis at the center, and its diameter $R_1$ is more preferably equal to or more than a diameter $R_2$ of the silicon single crystal which is pulled up. In other words, it is preferred that the exposed region 14a of the natural silica glass layer 14 covers the projection plane of 21S of the silicon single crystal 21. Furthermore, the diameter $R_2$ of the silicon single crystal is a few mm to tens of mm larger than the diameter of the final silicon wafer product.

The diameter $R_2$ of the silicon single crystal 21 is not principally determined by the shape or size of the silica glass crucible 20. However, it is significantly dependent on the diameter $R_0$ of the silica glass crucible 20. If the crucible diameter $R_0$ is too small with respect to the silicon single crystal diameter $R_2$, crystal quality control such as oxygen concentration and oxygen in-plane distribution of the single crystal becomes difficult, and if it is too large costs increase because it becomes necessary to increase the size of devices and components. Therefore, the diameter $R_2$ of the silicon single crystal 21 is usually set at $0.3R_0$-$0.6R_0$.

Considering such points, it is preferred that the diameter $R_1$ of the exposed region 14a of the natural silica glass layer 14 be $0.3R_0$ or more and $0.6R_0$ or less with respect to the diameter $R_0$ of the silica glass crucible 20. This is because when the diameter $R_1$ of the exposed region 14a of the natural silica glass layer 14 is smaller than $0.3R_0$, the projection plane 21S of the silicon single crystal 21 can not be covered and the possibility that gas bubbles of the SiO gas which is produced from the synthetic silica glass layer 15 are incorporated into the silicon single crystal increases. When the diameter $R_1$ of the exposed region of the natural silica glass layer 14 is larger than $0.6R_0$, the projection plane 21S of the silicon single crystal 21 can be securely covered but impurities which elute into the silicon melt 22 increase and cause a decrease in the silicon single crystal yield.

As explained above, in the silica glass crucible 20 of the present embodiment, because the exposed region 14a of the natural silica glass layer 14 is formed on the inner surface of the crucible bottom part 10B, it is possible to remove fine damage in the inner surface of the crucible bottom part 10B within the short time from a polysilicon melting process up to the start of pulling up the single crystal. Therefore, it is possible to control the generation of SiO gas caused by damage in the crucible inner surface and prevent the generation of cavity defects within the silicon single crystal.

Figure 7:
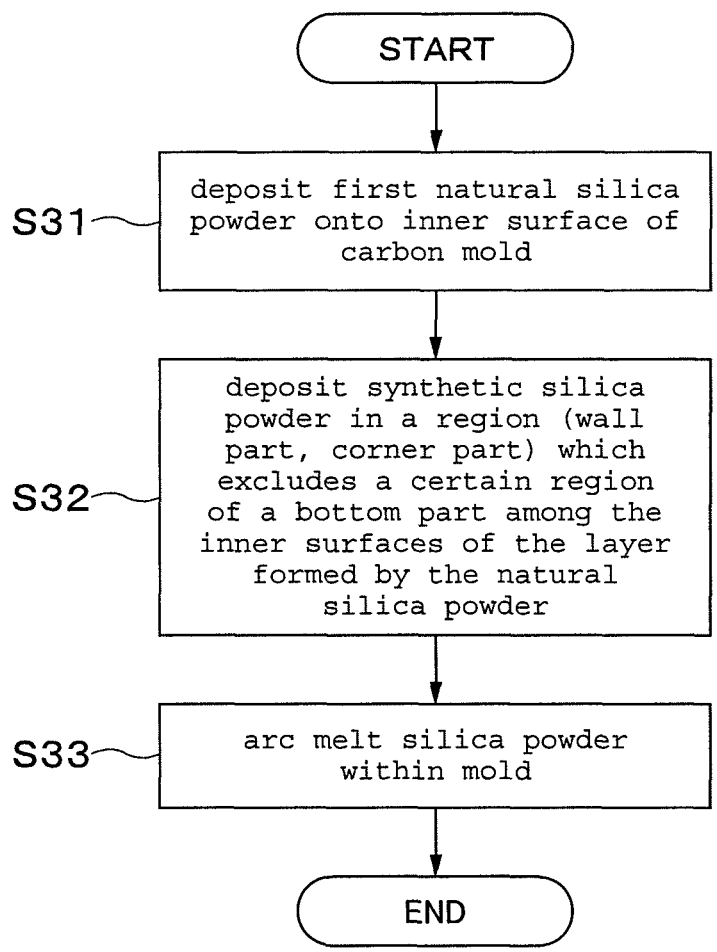
FIG. 7 is a flow chart which shows a manufacturing method of a silica glass crucible for pulling up a silicon single crystal according to the second embodiment of the present invention.

Next, a manufacturing method of the silica glass crucible 20 will be explained while referring to the flow chart in FIG. 7.

The silica glass crucible 20 can be manufactured by a rotating mold method. In the rotating mold method, natural silica powder which is the raw material for the natural silica glass layer 14 is deposited to a certain thickness on an inner surface of a rotating carbon mold (step S31). Then, a synthetic silica powder which is the raw material for the synthetic silica glass layer is deposited at a certain thickness on a region excluding a certain region from the center of the bottom part of the inner surface of the layer formed by the natural silica powder (step S32). At this time, while it is preferred that a synthetic silica powder which is the raw material for the synthetic silica glass layer 15 is deposited at a certain thickness on a region excluding a certain region from the center of the bottom part of the inner surface of the layer formed by the natural silica powder, the synthetic silica powder may also be deposited on the entire inner surface. When the synthetic silica powder is deposited in a region which excludes the bottom part center, the synthetic silica powder is deposited only on the wall part and corner part of the layer formed by the natural silica powder and is not deposited on the bottom part.

The Ca concentration of the natural silica powder used at this time is required to be 0.5 ppm or less and the concentration of Al is required to be 20 ppm or less. The area (diameter) and thickness of the natural silica glass layer 14 can be adjusted by the fill position and fill weight of the natural silica powder, and can also be adjusted by the rotation speed of the mold. Because it is sufficient to form the synthetic silica glass layer 15 only on the crucible wall part and corner part, the fill weight of the synthetic silica powder may be less than natural silica powder.

Following this, the entire inner surface of the silica powder is heated to 1720° C. or more from the interior of the mold by a discharge heat due to an arc electrode which is arranged on the center upper part of the mold and the silica powder is arc melted (step S33). In addition, at the same time as this heating, pressure decreases from the mold side, gas within the melt silica is sucked to the outer layer side via a vent arranged in the mold, and by discharging the gas to the outside via the vent the gas bubbles of the crucible inner surface are partially removed and a transparent layer is formed with essentially no gas bubbles. Following this, the pressure is weakened or stopped and an opaque layer is formed including multiple tiny gas bubbles by continuing heating further and forcing the gas bubbles to remain. By the above, the silica glass crucible 20 which is arranged with the natural silica glass layer 14 which forms the outer layer in the bottom part and wall part of the crucible, and the synthetic silica glass layer 15 which forms the inner surface in the crucible wall part, is completed.

Furthermore, in the formation of the synthetic silica glass layer 15, it is not always necessary to not deposit synthetic silica powder in the region in which the natural silica glass layer 14 is exposed. It is possible to clear the deposited synthetic silica powder during arc melting, vaporize the synthetic silica layer by heat reinforcement and draw the synthetic silica powder to the corner part side by adjusting the number of rotations of the mold.

The synthetic silica glass layer 15 of the silica glass crucible 20 can also be manufactured by what is called thermal splaying. Specifically, after creating the basic structure of the silica glass crucible which is comprised only of the natural silica glass layer 14 by an arc melting process, the natural silica powder is thermal splayed onto the inner surface of this silica glass crucible wall part 10A and corner part 10C and the synthetic silica glass layer 15 is formed. In this way, it is possible to manufacture the silica glass crucible 20 of the present embodiment by additional processing of the existing single layer structured silica glass crucible.

The manufacturing method of the silicon single crystal which uses the silica glass crucible 20 is essentially the same as the manufacturing method of the silicon single crystal which uses the silica glass crucible 10. In the case of the silica glass crucible 20, because the exposed region 14a of the natural silica glass layer 14 exists at the bottom part of the crucible, the second natural silica glass 13 may be read as the natural silica glass layer 14.

Even in the case of using the silica glass crucible 20, because the wall part of the silicon single crystal is pulled up after removing or sufficiently reducing the fine damage which exists in the inner surface of the crucible bottom part, it is possible to pull up the silicon single crystal in a state with almost no damage on the projection plane of the silicon single crystal. As a result, it is possible to prevent the generation of SiO gas caused by the fine damage and effectively prevent the generation of cavity effects due to the SiO gas. Furthermore, impurities are eluted due to melting of the natural silica glass layer 14. However, because the benefits of preventing cavity defects are much larger compared to the bad effects caused by elution of impurities, significant effects can be obtained in the manufacture of the silicon single crystal.

The present invention has thus been shown and described with reference to specific embodiments. However, it should be noted that the present invention is in no way limited to the details of the described arrangements but changes and modifications may be made without departing from the scope of the appended claims.

For example, in the first embodiment described above, the crucible included a two layer structure comprising the first natural silica glass layer 11 and the synthetic silica glass layer 12 in the wall part 10A and the corner part 10C, and also a three layer structure comprised of the first natural silica glass layer 11, the synthetic silica glass layer 12 and the second natural silica glass layer 13 in the bottom part 10B. However, a further layer may be formed on the exterior of the first natural silica glass layer 11, a center layer may also be formed between the first natural silica glass layer 11 and the synthetic silica glass layer 12, and a further layer may be arranged on the interior of the second natural silica glass layer 13. In addition, with the aim of preventing surface level vibration of the silicon melt, a single layer structure is also possible comprised only of the first natural silica glass layer 11 from near an initial surface level position up to the top end (opening) of the wall part 10A. Furthermore, it is also possible to arbitrarily adjust an gas bubble containing ratio in the vicinity of the inner surface of the crucible wall part 10A at an initial surface level position.

In addition, in the second embodiment described above, the crucible included a two layer structure comprising the natural silica glass layer 14 and the synthetic silica glass layer 15 in the wall part 10A and the corner part 10C, and also a single layer structure comprised of the natural silica glass layer 14, in the bottom part. However, a further layer may be formed on the exterior of the natural silica glass layer 14, a center layer may also be formed between the natural silica layer 14 and the synthetic silica glass layer 15, and a further layer may be arranged on the interior of the synthetic silica glass layer 15. In addition, with the aim of preventing surface level vibration of the silicon melt, a single layer structure is also possible comprised only of the natural silica glass layer 14 from near an initial surface level position up to the top end (opening) of the wall part 10A. Furthermore, it is also possible to arbitrarily adjust an gas bubble containing ratio in the vicinity of the inner surface of the crucible wall part 10A at an initial surface level position.

EXAMPLES

Example 1

Samples A1-A7 of a silica glass crucible having the same structure as the silica glass crucible 10 shown in FIG. 1 and a different thickness $t_1$ to the second natural silica glass layer were prepared. Each sample A1-A7 had a diameter of 32 inches, crucible height of 500 mm, and wall part thickness of 17 mm, corner part thickness of 25 mm and bottom part thickness of 14 mm from the inner surface to the exterior surface of the crucible. Detailed conditions of each sample are shown in chart 1. As is shown in chart 1, the second natural silica glass layer arranged on the samples A1-A7 had the same diameter $R_1$ and the same Ca concentration respectively but had a different thicknesses $t_1$.

Next, using the samples A1-A7 of these silica glass crucibles, after charging 400 kg of polysilicon into each sample, the samples were loaded into a single crystal pulling up device, the polysilicon was melted and the silicon single crystal was pulled up.

Following this, wafers of approximately 1 mm thickness were cut from the silicon single crystal ingot that was pulled up using a wire saw and a polished wafer with a mirror polished surface was created using a CMP process. Then, the generation percentage of pinholes in this polished wafer was measured. A particle measurement device was used to measure the pinhole generation percentage and the number of pinholes in the surface of the polished wafer was measured. The pinhole generation percentage is a figure in which the total number of pinholes included within multiple wafers obtained from one silicon single crystal divided by the number of wafers.

In addition, the single crystal yield of the silicon single crystal ingot which was obtained was also measured. The single crystal yield is defined as the weight ratio of the silicon single crystal with respect to the polysilicon raw material. Not all of the polysilicon which is introduced into the crucible is completely consumed, and because a slight amount of the silicon melt remains in the crucible after the pulling up process is finished, the single crystal yield is below 100% even if a sufficient amount of the silicon single crystal was pulled up. 80% or more is favorable. The measurement results are shown in chart 1.

CHART 1

| Crucible sample | A1 | A2 | A3 | A4 | A5 | A6 | A7 |
| --- | --- | --- | --- | --- | --- | --- | --- |
| Diameter R1 (mm) of the second natural silica glass layer | | | | 320 | | | |
| Thickness t1 (μm) of the second natural silica glass layer | 10 | 20 | 30 | 50 | 100 | 200 | 250 |
| Ca concentration (ppm) | | | | 0.4 | | | |
| Pinhole generation rate (%) | 8.1 | 5.3 | 0 | 0 | 0 | 0 | 0 |
| Single Crystal Yield (%) | 90 | 90 | 90 | 90 | 90 | 80 | 45 |
| Result | X | X | ◎ | ◎ | ◎ | ○ | X |

As is shown in chart 1, in the samples A3-A6 in which the thickness $t_1$ of the second natural silica glass layer is 30 μm or more and 200 μm or less, the pinhole generation rate was 0% and the single crystal yield was 80% or more. In particular, in the samples A3-A5 in which the thickness $t_1$ of the second natural silica glass layer is 30 μm or more and 100 μm or less, a particularly high single crystal yield of 90% or more was obtained.

In the sample A1, however, which has a thickness $t_1$ of 10 μm, the single crystal yield was 90% and the pinhole production rate increased to 8.1%. In addition, in the sample A2 which had a thickness $t_1$ of 20 μm, the single crystal yield was 90% and the pinhole production rate increased to 5.3%. Furthermore, in the sample A7 which had a thickness $t_1$ of 250 μm, the pinhole production rate was 0% but the single crystal yield dropped significantly to 45%.

Example 2

Samples B1-B6 of a silica glass crucible having the same structure as the silica glass crucible 10 shown in FIG. 1 and a different Ca concentration to the second natural silica glass layer 13, and a sample C1 in which a synthetic silica glass was used instead of the second natural silica glass layer 13, were prepared. The Ca concentration was measured using a combined induced plasma emission spectrometry analysis method (ICP-AES). Each of the samples B1-B6 and C1 had a diameter of 32 inches, wall part length of 300 mm, and thickness of 17 mm from the inner surface to the exterior surface. Detailed conditions of each sample are shown in chart 2. As is shown in chart 2, the second natural silica glass layer arranged on the samples B1-B7 had the same diameter $R_1$, and the same thicknesses $t_1$ respectively but had a different Ca concentration.

Next, using the samples B1-B6 and C1, the process of pulling up the silicon single crystal was performed with the same conditions as example 1, and a polished wafer was created from the silicon single crystal that was obtained. The pinhole generation percentage of this silicon single crystal was measured. In addition, the single crystal yield of the silicon single crystal ingot which was obtained was also measured. Those results are shown in chart 2.

single crystal yield was 80% or more. In particular, in the samples B1-B3 in which the Ca concentration of the second natural silica glass layer was 0.4 ppm or less, a particularly high single crystal yield of 90% or more was obtained.

In the sample B5, however, which had Ca concentration of 0.55 ppm, the pinhole production rate was 0% and the single crystal yield dropped significantly to 55%. In addition, in the sample B6 which had a Ca concentration of 0.6 ppm, the pinhole production rate was 0% and the single crystal yield dropped significantly to 50%. Furthermore, in the sample C1 which used the synthetic silica glass layer instead of the natural silica glass layer, the single crystal yield was 90% but the pinhole production rate increased to 9.7%.

Example 3

Samples A1-A6 of a silica glass crucible having the same structure as the silica glass crucible 20 shown in FIG. 5 and a different Ca concentration and Al concentration to the natural silica glass layer 14, and a sample B1 of a silica glass crucible (that is, a crucible comprised from an inner layer of entirely synthetic silica glass) in which the whole crucible had a two layer structure, were prepared. The Ca concentration and Al concentration were measured using a combined induced plasma emission spectrometry analysis method (ICP-AES). Each of the samples A1-A6 and B1 had a diameter of 32 inches (diameter of 800 mm), wall part length of 300 mm, and the crucible thickness was 17 mm at the wall part, 14 mm a the bottom part and 25 mm at the corner part.

Next, after filling 400 kg polysilicon fragments into the silica glass crucible samples A1-A6 and B1, the samples were loaded into a single crystal pulling up device, the polysilicon inside the crucible was melted by a furnace and a silicon single crystal ingot with a diameter of approximately 320 mm was pulled up.

Following this, wafers of approximately 1 mm thickness were cut from the silicon single crystal ingot that was pulled up using a wire saw and a polished wafer with a mirror polished surface was created using a CMP process. Then, the generation percentage of pinholes in this polished wafer was

CHART 2

| Crucible sample | B1 | B2 | B3 | B4 | B5 | B6 | C1 |
|---|---|---|---|---|---|---|---|
| Raw material | Natural Silica | | | | | | Synthetic Silica |
| Diameter R1 (mm) of the second silica glass layer | 320 | | | | | | |
| Thickness t1 (μm) of the second silica glass layer | 100 | | | | | | |
| Ca concentration (ppm) | 0.22 | 0.31 | 0.4 | 0.5 | 0.55 | 0.61 | 0.02 |
| Pinhole generation rate (%) | 0 | 0 | 0 | 0 | 0 | 0 | 9.7 |
| Single Crystal Yield (%) | 90 | 90 | 90 | 80 | 55 | 50 | 90 |
| Result | ⊚ | ⊚ | ⊚ | ○ | X | X | X |

As is shown in chart 2, in the samples B1-B4 in which the Ca concentration of the second natural silica glass layer was 0.50 ppm or less, the pinhole generation rate was 0% and the measured. In addition, the single crystal yield of the silicon single crystal ingot that was obtained was also measured. Those results are shown in chart 3.

CHART 3

| Crucible sample | A1 | A2 | A3 | A4 | A5 | A6 | B1 |
|---|---|---|---|---|---|---|---|
| Raw material of crucible bottom surface | Natural Silica | | | | | | Synthetic Silica |
| Ca concentration (ppm) | 0.3 | 0.3 | 0.4 | 0.5 | 0.6 | 0.4 | 0.02 |
| Al concentration (ppm) | 6 | 15 | 8 | 20 | 15 | 25 | <0.01 |
| Pinhole generation rate (%) | 0 | 0 | 0 | 0 | 0 | 0 | 3.5 |
| Single Crystal Yield (%) | 95 | 90 | 90 | 85 | 45 | 50 | 90 |
| Result | ⊚ | ⊚ | ⊚ | ○ | X | X | X |

As is shown in chart 3, in the samples A1-A4 in which the Ca concentration was 0.5 ppm or less, and the Al concentration was 20 ppm or less of the natural silica glass layer, the pinhole generation rate was 0% and the single crystal yield was 85% or more. In particular, in the samples A1-A3 in which the Ca concentration was 0.4 ppm or less of the natural silica glass layer, a particularly high single crystal yield of 90% or more was obtained. Furthermore, in the sample A1 in which the Ca concentration was 0.3 ppm and the Al concentration was 6 ppm of the natural silica glass layer, a particularly high single crystal yield of 95% or more was obtained In the sample A5, however, which had Ca concentration of 0.6 ppm, the pinhole production rate was 0% and the single crystal yield dropped significantly to 45%. In addition, in the sample A6 which had an Al concentration of 25 ppm, the pinhole production rate was 0% and the single crystal yield dropped significantly to 50%. Furthermore, in the sample B1 in which the bottom part is also formed with the synthetic silica glass layer, the single crystal yield was 90% but the pinhole production rate increased to 3.5%.

What is claimed is:

1. A silica glass crucible for pulling up a silicon single crystal including a wall part and a bottom part comprising:
    a first natural silica glass layer which forms at an outer layer in the wall part and the bottom part;
    a synthetic silica glass layer which forms an inner layer in the wall part and the bottom part, and which is exposed in at least the wall part; and
    a second natural silica glass layer which covers a region which includes the center of the bottom part among the inner surfaces of the synthetic silica glass layer; wherein
    a concentration of Ca included in the second natural silica glass layer is 0.5 ppm or less, and a thickness of the second natural silica glass layer is 30 μm or more and 200 μm or less.

2. The silica glass crucible as claimed in claim 1, wherein a flat region of the second natural silica glass layer includes a projection plane of the silicon single crystal.

3. The silica glass crucible as claimed in claim 2, wherein a diameter of the flat region of the second natural silica glass layer is $0.3R_0$ or more and $0.6R_0$ or less with respect to a diameter $R_1$ of an opening of the crucible.

4. The silica glass crucible as claimed in claim 1, wherein a concentration of Ca included in the second natural silica glass layer is 0.4 ppm or less.

5. The silica glass crucible as claimed in claim 1, wherein a thickness of the second natural silica glass layer is 30 μm or more and 100 μm or less.

* * * * *